United States Patent
Lin et al.

(10) Patent No.: US 11,088,249 B2
(45) Date of Patent: Aug. 10, 2021

(54) SEMICONDUCTOR DEVICE WITH IMPLANT AND METHOD OF MANUFACTURING SAME

(71) Applicant: Taiwan Semiconductor Manufacturing Company, Ltd., Hsinchu (TW)

(72) Inventors: Yu-Chang Lin, Hsinchu (TW); Tien-Shun Chang, New Taipei (TW); Chun-Feng Nieh, Hsinchu (TW); Huicheng Chang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/573,897

(22) Filed: Sep. 17, 2019

(65) Prior Publication Data
US 2021/0083056 A1    Mar. 18, 2021

(51) Int. Cl.
| | |
|---|---|
| *H01L 29/10* | (2006.01) |
| *H01L 29/78* | (2006.01) |
| *H01L 29/06* | (2006.01) |
| *H01L 21/265* | (2006.01) |
| *H01L 29/66* | (2006.01) |
| *H01L 21/266* | (2006.01) |
| *H01L 21/324* | (2006.01) |
| *H01L 21/225* | (2006.01) |

(52) U.S. Cl.
CPC ...... *H01L 29/1054* (2013.01); *H01L 21/2253* (2013.01); *H01L 21/266* (2013.01); *H01L 21/26513* (2013.01); *H01L 21/26586* (2013.01); *H01L 21/324* (2013.01); *H01L 29/0653* (2013.01); *H01L 29/6659* (2013.01); *H01L 29/66795* (2013.01); *H01L 29/7834* (2013.01); *H01L 29/7851* (2013.01)

(58) Field of Classification Search
CPC .......... H01L 29/66803; H01L 21/2254; H01L 29/7833; H01L 27/0924
See application file for complete search history.

(56) References Cited

U.S. PATENT DOCUMENTS

| | | |
|---|---|---|
| 8,962,400 B2 | 2/2015 | Tsai et al. |
| 9,093,514 B2 | 7/2015 | Tsai et al. |
| 9,236,267 B2 | 1/2016 | De et al. |

(Continued)

OTHER PUBLICATIONS

Liao, M.-H. et al. "The relaxation of intrinsic compressive stress in complementary metal-oxide-semiconductor transistors by additional N ion implantation treatment with atomic force microscope-Raman stress extraction," Journal of Applied Physics, vol. 111, No. 9, May 2012, 4 pages.

(Continued)

*Primary Examiner* — Changhyun Yi
(74) *Attorney, Agent, or Firm* — Slater Matsil, LLP

(57) ABSTRACT

A FinFET is provided including a channel region containing a constituent element and excess atoms, the constituent element belonging to a group of the periodic table of elements, wherein said excess atoms are nitrogen, or belong to said group of the periodic table of elements, and a concentration of said excess atoms in the channel region is in the range between about $10^{19}$ cm$^{-3}$ and about $10^{20}$ cm$^{-3}$.

19 Claims, 15 Drawing Sheets

(56) References Cited

U.S. PATENT DOCUMENTS

| | | | |
|---|---|---|---|
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,576,814 B2 | 2/2017 | Wu et al. | |
| 9,608,116 B2 | 3/2017 | Ching et al. | |
| 9,812,363 B1 | 11/2017 | Liao et al. | |
| 9,859,380 B2 | 1/2018 | Lee et al. | |
| 2017/0352656 A1* | 12/2017 | Huang | G06F 21/44 |
| 2018/0151706 A1* | 5/2018 | Lin | H01L 29/66545 |
| 2020/0105754 A1* | 4/2020 | Murthy | H01L 29/785 |
| 2020/0105928 A1* | 4/2020 | Lee | H01L 21/823493 |

OTHER PUBLICATIONS

Serra, N. et al., "Experimental and physics-based modeling assessment of strain induced mobility enhancement in FinFETs," IEEE International Electron Devices Meeting (IEDM), Dec. 7-9, 2009, Baltimore, MD, 4 pages.

* cited by examiner

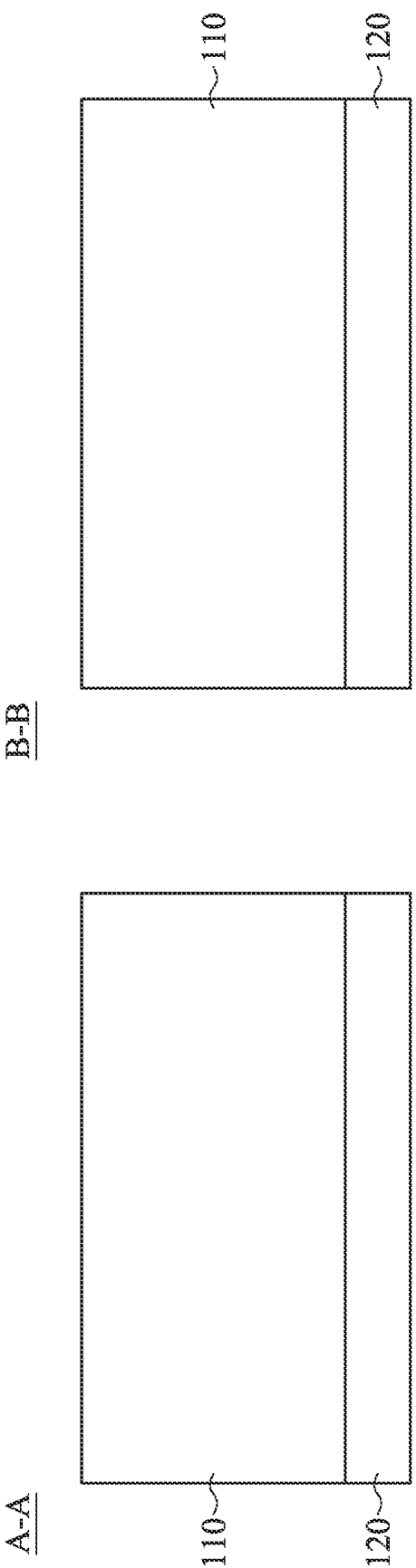

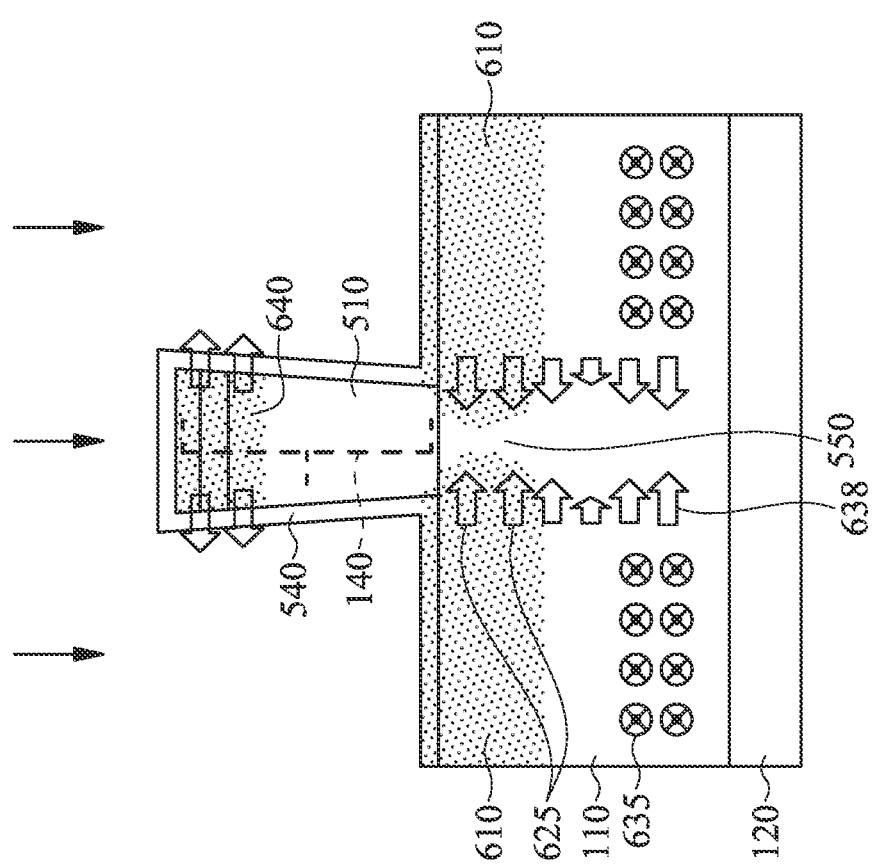
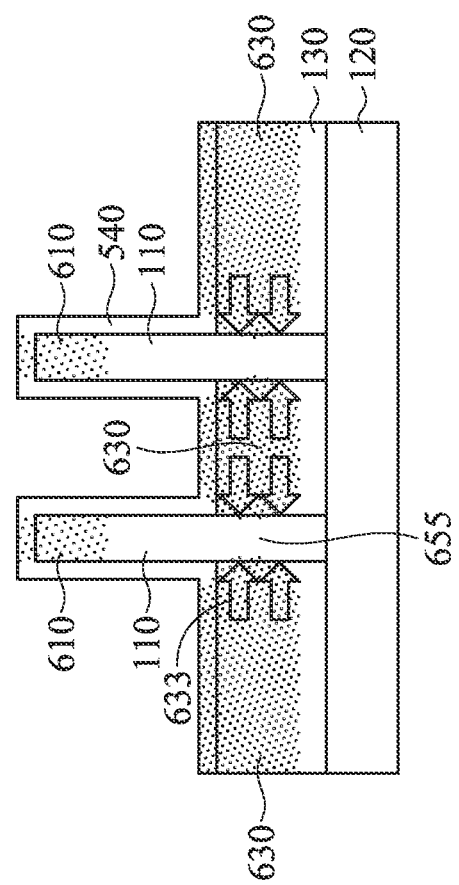
FIG. 6A
FIG. 6B

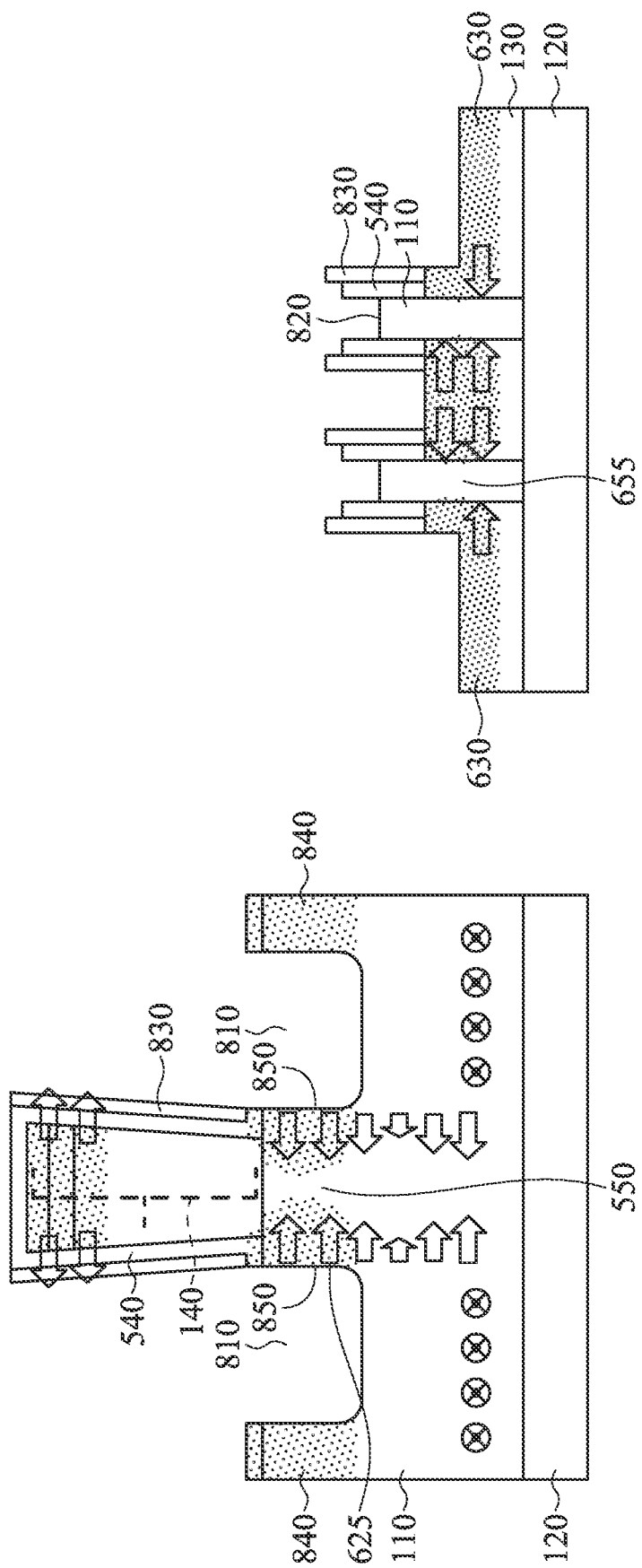

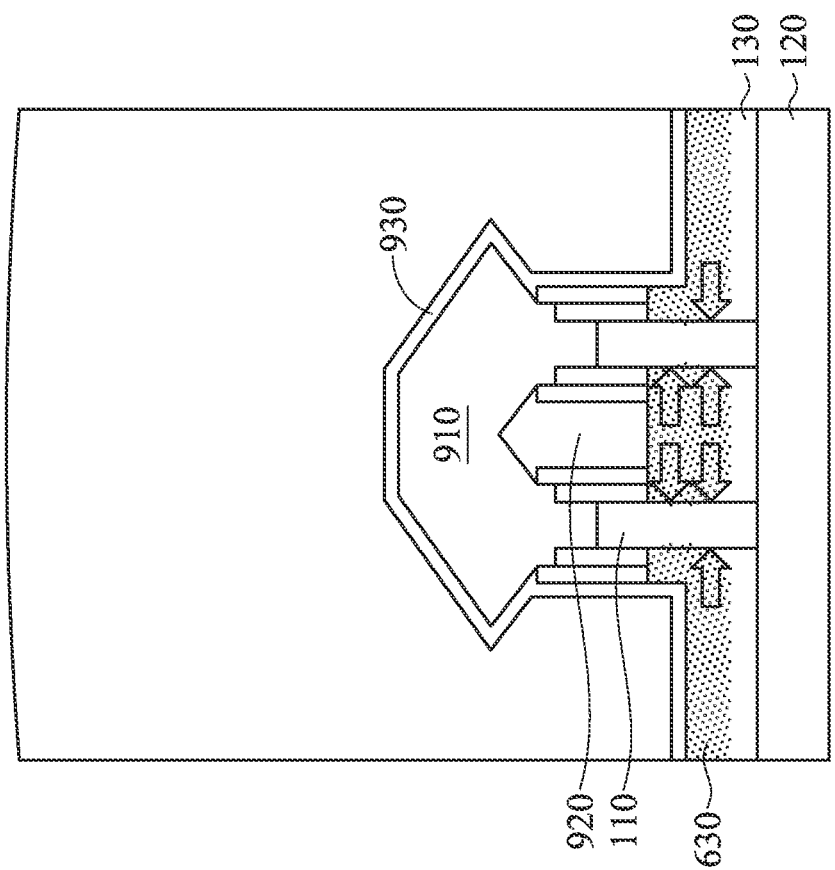
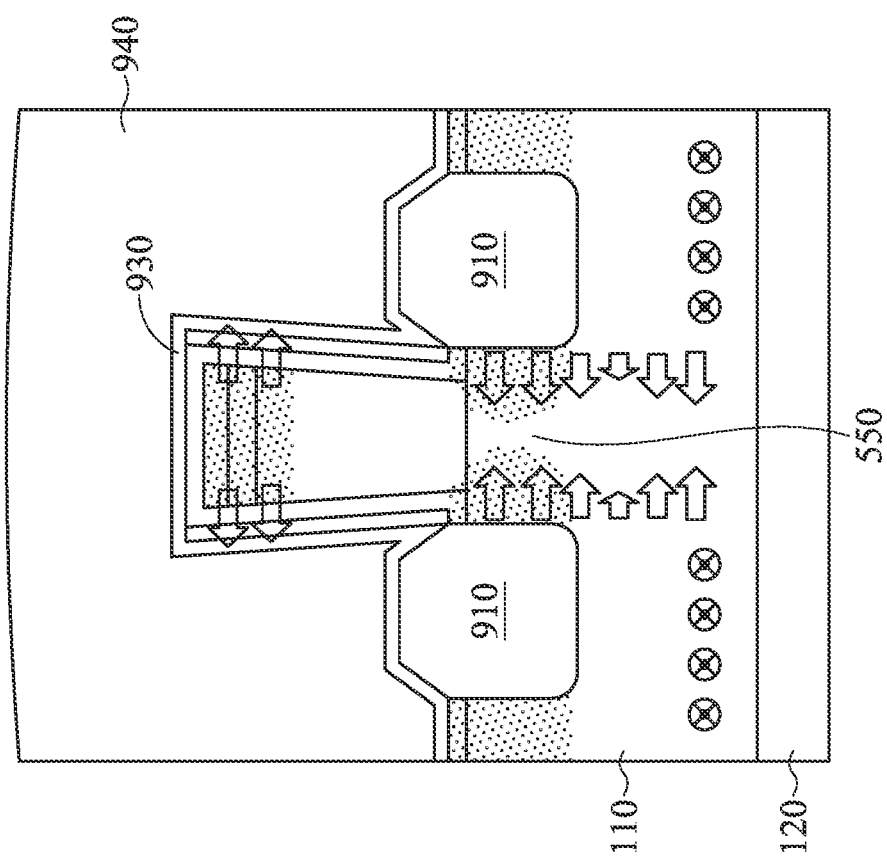
FIG. 9A
FIG. 9B

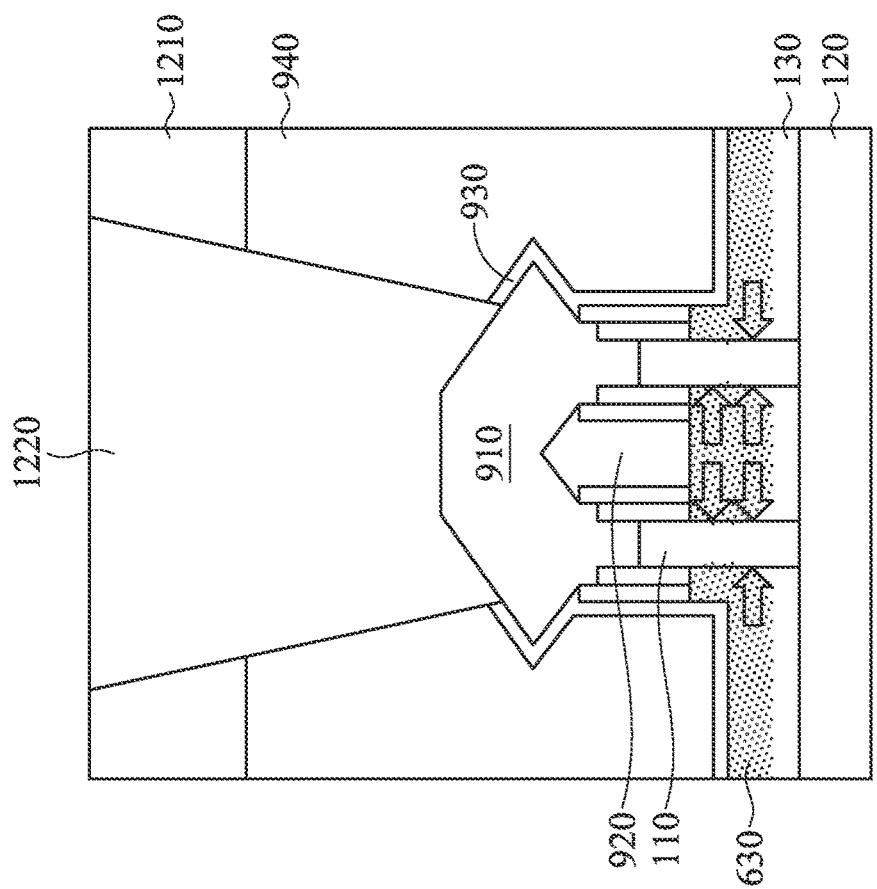
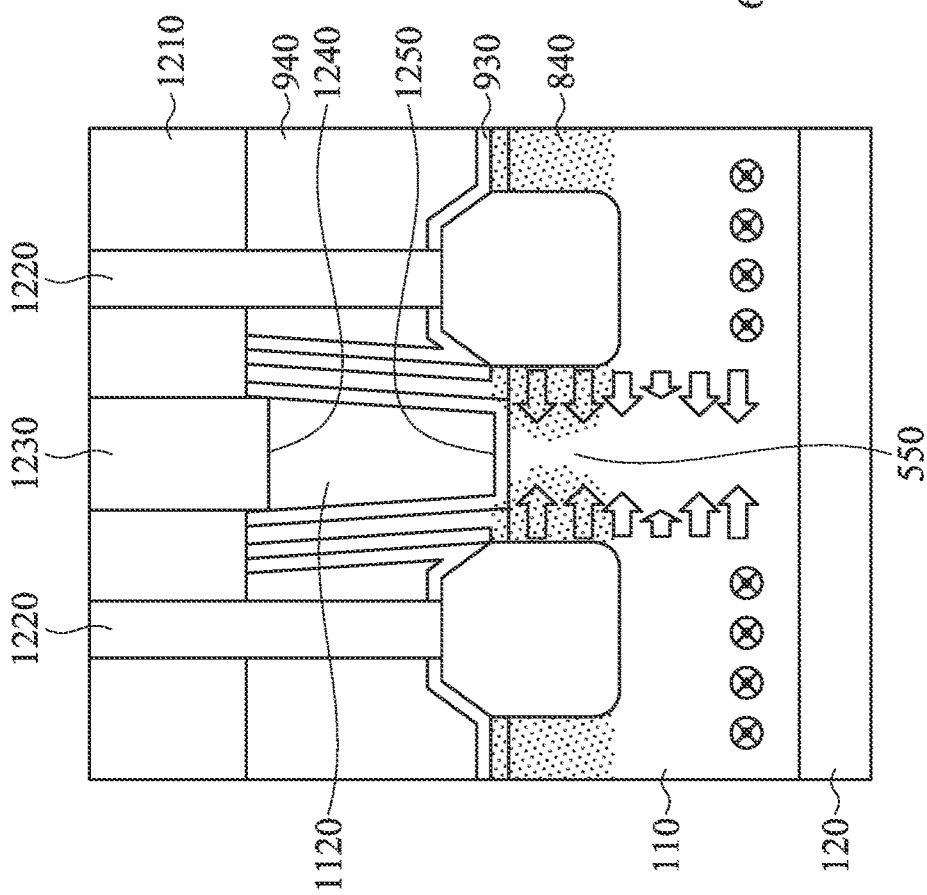
FIG. 12B
FIG. 12A

| Device Type | Implant Gas | Energy | Dose | Depth / Range | Tilt Angle |
|---|---|---|---|---|---|
| PFET | SiF$_4$ | 5 – 30 keV | $10^{15} - 10^{17}$ cm$^{-2}$ | | 0 – 30 ° |
| PFET | SiF$_4$ | | $10^{15} - 10^{17}$ cm$^{-2}$ | 20 – 40 nm | 0 – 30 ° |
| PFET | GeF$_4$ | 5 – 30 keV | $10^{15} - 10^{17}$ cm$^{-2}$ | | 0 – 30 ° |
| PFET | GeF$_4$ | | $10^{15} - 10^{17}$ cm$^{-2}$ | 20 – 40 nm | 0 – 30 ° |
| PFET | N$_2$ | 5 – 30 keV | $10^{15} - 10^{17}$ cm$^{-2}$ | | 0 – 30 ° |
| PFET | N$_2$ | < 15 keV | > $10^{17}$ cm$^{-2}$ | 20 – 40 nm | 0 – 30 ° |
| NFET | C | < 15 keV | > $10^{17}$ cm$^{-2}$ | | 0 – 30 ° |
| NFET | C | | > $10^{17}$ cm$^{-2}$ | 20 – 40 nm | 0 – 30 ° |
| NFET | N$_2$ | < 15 keV | > $10^{17}$ cm$^{-2}$ | | 0 – 30 ° |
| NFET | N$_2$ | | > $10^{17}$ cm$^{-2}$ | 20 – 40 nm | 0 – 30 ° |

FIG. 13

SEMICONDUCTOR DEVICE WITH IMPLANT AND METHOD OF MANUFACTURING SAME

TECHNICAL FIELD

This invention relates generally to semiconductor manufacturing, and more particularly to devices employing ion implantation and methods of manufacturing them.

BACKGROUND

The use of Fin Field-Effect Transistors (FinFETs) in lieu of planar transistors is among several recent developments in the semiconductor industry. In a FinFET, the transistor channel is formed substantially within a structure with a high aspect ratio, commonly called a fin. A FinFET gate covers not only the top, but also the sides of the fin. This configuration offers a number of advantages over planar transistors, including better control over channel inversion and greater reliability for the same performance.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 2A-4B are simplified cross-sectional views of selected FinFET structures in various stages of an example FinFET manufacturing process;

FIGS. 6A and 6B are simplified cross-sectional illustrations of selected p-FinFET structures following an embodiment of strain implantation in a PLDD process sequence;

FIGS. 8A and 8B are simplified cross-sectional illustrations of selected p-FinFET structures following source-drain recess in an example FinFET manufacturing process including an embodiment of strain implantation in a PLDD process sequence;

FIGS. 9A and 9B are simplified cross-sectional illustrations of selected p-FinFET structures following deposition of the first inter-level dielectric in an example FinFET manufacturing process including an embodiment of strain implantation in a PLDD process sequence;

FIGS. 12A and 12B are simplified cross-sectional illustrations of selected p-FinFET structures following formation of contacts in an example FinFET manufacturing process including an embodiment of strain implantation in a PLDD process sequence;

FIG. 13 is a table containing implantation parameters for some embodiments of strain implantation in FinFETs;

Figure 1:
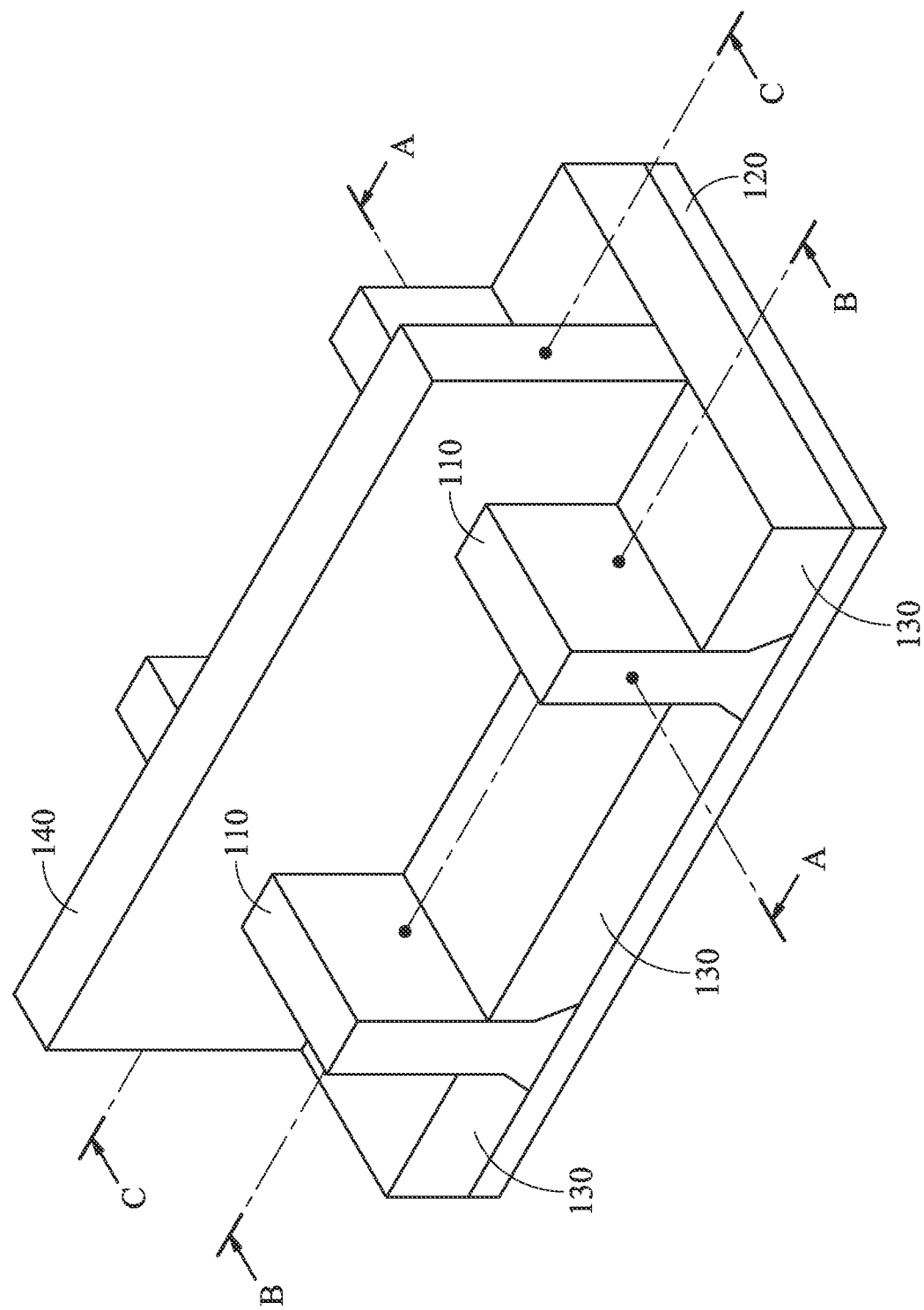
FIG. 1 is a simplified perspective view of selected elements of a structure comprising two FinFET channels at a stage of an example FinFET manufacturing process.

Corresponding numerals and symbols in different figures generally refer to corresponding parts unless otherwise indicated. The figures are drawn to illustrate clearly the relevant aspects of embodiments of the present disclosure and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the term "group-IV elemental semiconductor" is intended to refer to any elemental semiconductor composed substantially of a single element of group-IVA of the periodic table of elements, for example silicon (Si) or germanium (Ge). Likewise, the term "group-IV compound semiconductor" is intended to refer to any compound semiconductor composed substantially of elements of group-IVA of the periodic table of elements, including silicon-germanium, silicon germanium carbide, and silicon carbide, whether the composition of said compound is fixed or varying with position. Furthermore, the term "III-V compound semiconductor" is intended to refer to any compound semiconductor composed substantially of elements of groups IIIA and VA of the periodic table of elements, including GaAs, InGaAs, and the like. In addition, the formula $Si_{1-x}Ge_x$ is intended to refer to pure or substantially pure silicon, pure or substantially pure germanium, or silicon germanium of any composition whether said composition is constant or varying with position. Where the germanium content x is zero, $Si_{1-x}Ge_x$ signifies pure or substantially pure silicon, and where it is 1 or equivalently, 100%, $Si_{1-x}Ge_x$ signifies pure or substantially pure germanium.

Herein, the terms "p-FINFET" and "n-FinFET" refer to n-type and p-type FinFETs, respectively. In addition, the term "source-drain" is intended to mean source or drain. For example, a source-drain region is a region of a transistor structure serving or intended to serve as either the source or drain of said transistor. The term "implant species" is intended to refer to an implanted element, while the term "implant gas" is intended to refer to a gas used in an ion implantation machine to implant an implant species. For example, the implant gas $SiF_4$ may be used to implant the implant species Si. Strain or stress may be represented by arrows in figures herein. However, the length or width of arrows is not intended to convey information about the absolute or relative strength of said stress or strain, unless indicated otherwise expressly or by the context in which the arrows are used.

In a semiconductor manufacturing process, one or more anneal steps may be performed subsequent to an ion implantation step. Herein, the anneal step occurring earlier than any other anneal steps after an ion implantation step is referred to as annealing said ion implantation.

Some embodiments disclosed herein are described in the context of a FinFET manufacturing process, although the disclosed processes could apply to other structures as well. FIG. 1 is a simplified perspective view of selected elements of a structure comprising two FinFET channels at a stage of an example FinFET manufacturing process. At the stage of the example manufacturing process illustrated in FIG. 1, fins 110 have been formed on a substrate 120 and isolation regions 130 have been formed to isolate the fins 110 from each other and from other fins (not shown). In addition, a dummy gate stack 140 has been disposed along sidewalls and over top surfaces of the fins 110. Two transistor channel regions may be formed in portions of the fins 110 that are covered by the dummy gate stack 140. Referring to FIG. 1, a cross section A-A is defined herein as one taken along a plane perpendicular to the substrate 120 and passing through the line A-A, at any stage of the manufacturing process. Likewise, a cross section B-B is defined herein as one taken along a plane perpendicular to the substrate 120 and passing through the line B-B, at any stage of the manufacturing process. Similarly, a cross section C-C is defined herein as one taken along a plane perpendicular to the substrate 120 and passing through the line C-C, at any stage of the manufacturing process. FIGS. 2A-6A and 8A-12A, reference cross section A-A illustrated in FIG. 1, while FIGS. 2B-6B and 8B-12B reference cross section B-B illustrated therein.

FIGS. 2A-4B are simplified cross-sectional views of selected FinFET structures in various stages of an example FinFET manufacturing process. Referring to FIGS. 2A and 2B, an example manufacturing process begins on a substrate 120. The substrate 120 may be a bulk semiconductor substrate, a semiconductor-on-insulator (SOI) substrate, an insulating substrate, or the like. A bulk semiconductor substrate may be Si or a compound semiconductor, and it may be doped or undoped. An SOI substrate may comprise a layer of a semiconductor material formed on an insulator layer. The insulator layer may be, for example, a buried oxide (BOX) layer, a silicon oxide layer, or the like, and may itself be provided on an underlying substrate, typically a Si or glass substrate.

In the example manufacturing process illustrated in FIGS. 2A and 2B, a layer of material for the fins 110 is disposed on the substrate 120. In various examples, the material for the fins 110 may include one or more semiconductor layers deposited, for example by epitaxy, on the substrate 120. The material for the fins 110 may differ in composition from the underlying bulk material, and it may be undoped, or doped during growth or thereafter. For example, the material for the fins 110 may be or include Si, silicon germanium, pure or substantially pure Ge, silicon carbide, a III-V compound semiconductor, a II-VI compound semiconductor, or the like.

It is contemplated herein that in other manufacturing processes, no material may be deposited specifically for the fins 110 and the fins 110 may be produced from the substrate 120. In such processes, any line drawn between the material for the fins 110 and the substrate 120 in various figures does not represent a change in material properties, but rather serves as a guide to an interpretation of the approximate bottom of the fins 110 after fin manufacturing is complete.

Figure 3B:
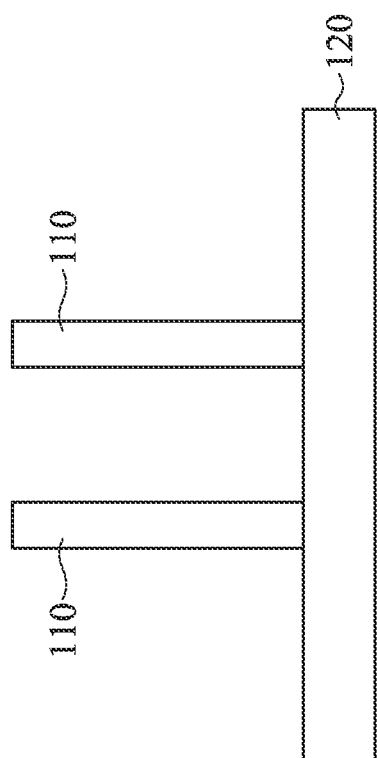
Figure 3A:
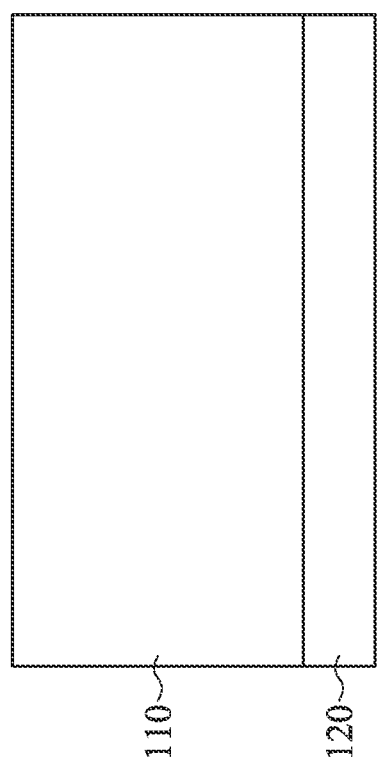

In FIGS. 3A and 3B, fins 110 have been produced on the substrate 120. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, a sacrificial layer may be formed over a substrate and patterned using a photolithography process. Spacers may be formed alongside the patterned sacrificial layer using a self-aligned process. The sacrificial layer may then be removed, and the remaining spacers may be used to pattern the fins.

Fins may be produced by various methods, including etching away regions of a layer on the substrate, or depositing fin material into narrow trenches. In processes where fins are produced by etching away regions of a layer, the fin pattern may be transferred to one or more underlying masking layers. Such masking layers may be or include silicon nitride, silicon oxynitride, silicon carbide, silicon carbon nitride, the like, or a combination thereof. An anisotropic etch may then be employed to etch away material except in the fin areas.

Figure 4B:
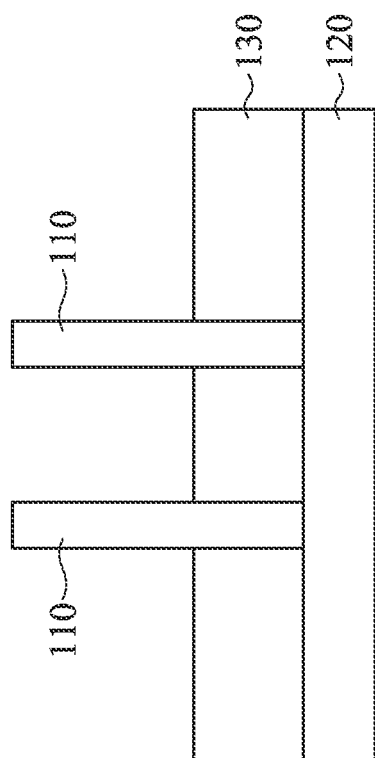
Figure 4A:
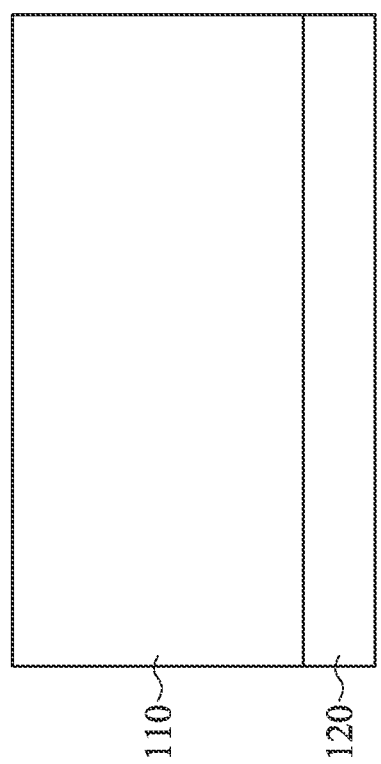

In FIGS. 4A and 4B, isolation regions 130 have been disposed between the fins 110. Isolation regions 130 may include or be an insulating material such as silicon oxide, silicon nitride, the like, or a combination thereof, formed by a suitable deposition process. For example, the isolation regions 130 may include silicon oxide formed by a Flowable Chemical Vapor Deposition (FCVD) process. Other insulating materials formed by any acceptable process may also be used. A planarization process, such as a Chemical Mechanical Polish (CMP), may be used to remove any excess material such that the top surfaces of the insulating material and the fins 110 are coplanar. The insulating material may then be recessed to form the isolation regions 130, allowing the fins 110 to protrude from and between the isolation regions 130. The insulating material may be recessed using any acceptable etch process, such as one that is selective to the material of the insulating material. Depending on the details of the process, top surfaces of the isolation regions 130 may be flat as illustrated, be convex or concave, or exhibit more complex shapes.

Alternative manufacturing processes, in which fins are produced by depositing fin material into narrow trenches, are more complex than those described above and may involve additional features not illustrated in the figures herein. In an example process, a dielectric layer may be formed over a top surface of the semiconductor substrate 120, trenches can be etched through the dielectric layer, fin material can be epitaxially grown in the trenches, and the dielectric layer can be recessed such that the fin material protrudes from the dielectric layer to form fins. The epitaxial material may be the same as or different from the substrate, and it may be undoped, or doped during or after growth. In such processes, it may be particularly advantageous to grow different materials for n-type and p-type FinFETs, respectively, for example to maximize career mobility in each device type. Fins or portions thereof may be formed, for example, from silicon germanium, silicon carbide, pure or substantially pure Ge, III-V compound semiconductors, II-VI compound semiconductors, or the like. Available materials for forming III-V compound semiconductor include, but are not limited to, GaAs, InAs, InGaAs, AlAs, InGaAs, InAlAs, InP, GaN, GaSb, AlSb, AlP, GaP, and the like.

Appropriate wells (not shown) may be formed in the fins 110 and/or the substrate 120. For example, a p-well may be formed substantially where n-FinFETs will be disposed, an n-well may be formed substantially where p-FinFETs will be disposed, or both p-wells and n-wells may be formed. Doping for p-wells and n-wells may be provided by ion implantation. Accordingly, the fins 110, the isolation regions 130, the substrate 120, and any other features present on the substrate during well implantation may contain dopants from the well implantation process. Dopants used to form n-wells may be phosphorus, arsenic, antimony, or the like. Dopants used to form p-wells may be boron, $BF_2$, indium, or the like. One or more annealing steps may be performed to activate the implanted dopants. In some processes, the substrate and/or the fin materials may be doped during crystal growth or deposition, and well implantation may not be necessary.

Figure 5B:
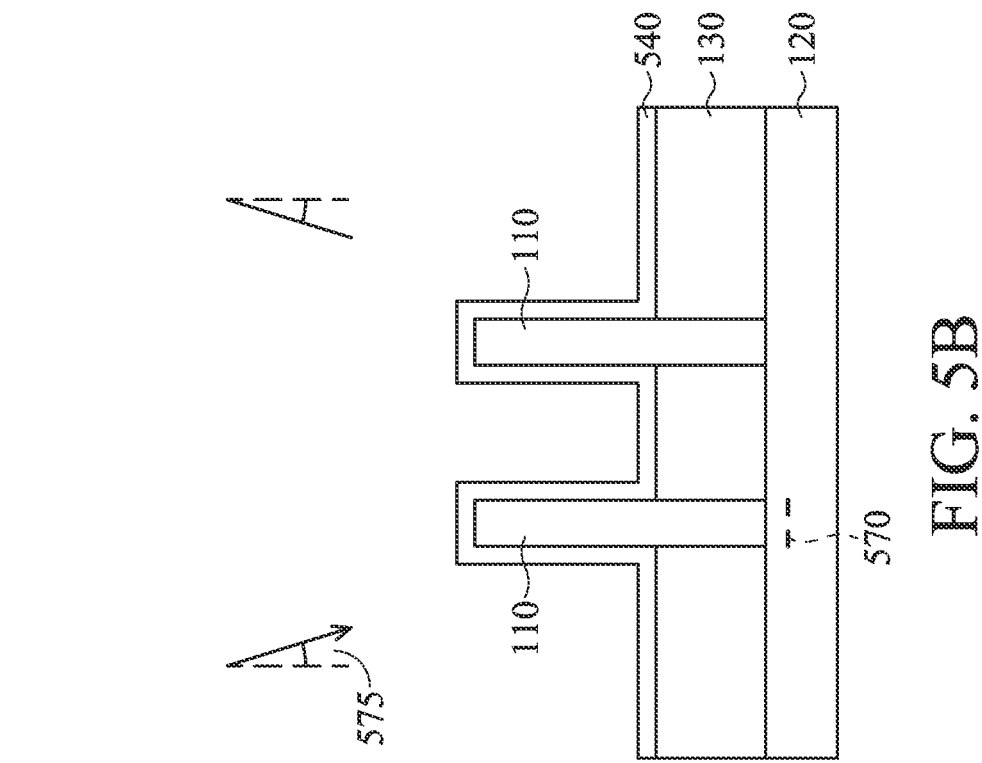
FIGS. 5A and 5B are simplified cross-sectional illustrations of selected structures prior to an LDD process sequence of an example FinFET manufacturing process.
Figure 5A:
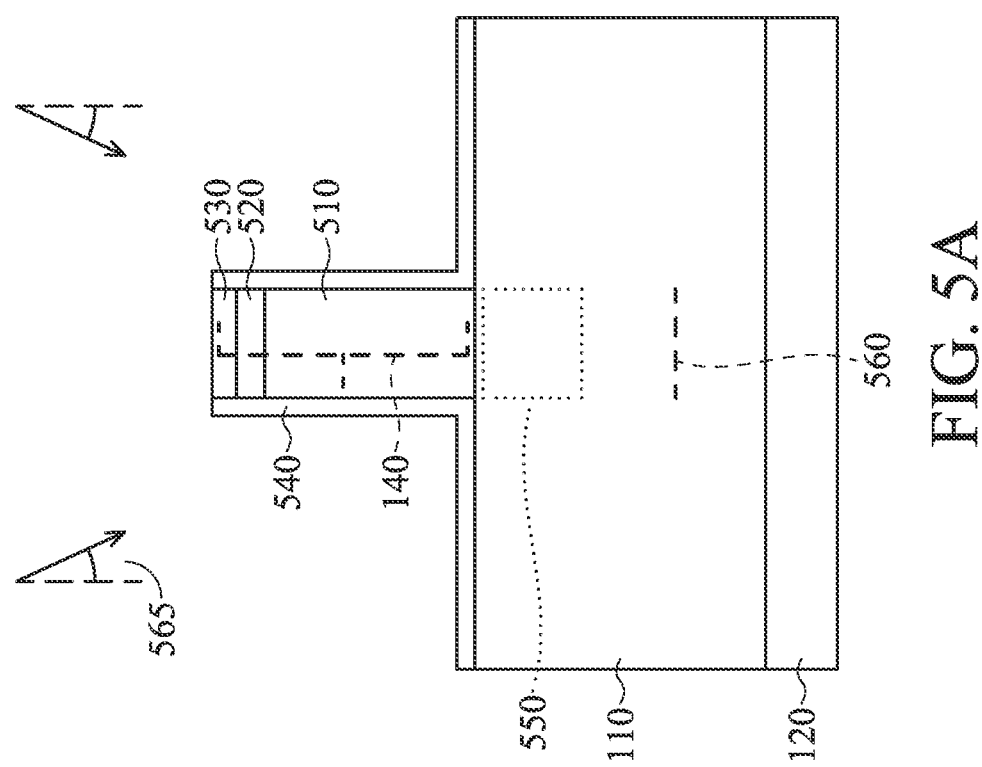

FIGS. 5A and 5B are simplified cross-sectional illustrations of selected structures prior to a Lightly Doped Drain (LDD) process sequence, described below, of an example FinFET manufacturing process. The dummy gate stack 140 illustrated in FIG. 1 may comprise a dummy gate 510 and one or more additional layers, such as a silicon-nitride layer 520, and an oxide layer 530. In addition, a first gate dielectric (not shown) may be disposed interjacent the fins 110 and the dummy gate 510. The first gate dielectric may include or be silicon oxide, silicon nitride, a high-k dielectric, the like, or multi-layers thereof, and may be thermally grown and/or chemically or conformally deposited, by a suitable deposition technique. A channel region 550 of the fin 110 will serve as the channel of the FinFET transistor upon completion of the manufacturing process. In some example manufacturing processes, a first spacer 540 may be disposed on the fins 100 and on the sides of the gate stack 140. The spacer 540 may be or comprise silicon nitride, silicon oxide, silicon oxynitride, or the like. In an embodiment, the spacer 540 is silicon nitride.

In FIG. 5A, a dashed line 560 indicates the direction of the FinFET channel length. Moreover, a tilt angle 565 indicates a tilt in the direction of the FinFET channel length. In FIG. 5B, a dashed line 570 indicates the direction of the fin width. A tilt angle 575 indicates a tilt in the direction of the fin width. If ion implantation is to be performed with a tilt and produce symmetric implant profiles on opposite sides of symmetric features, the implantation is commonly performed in two steps. Two halves of the total dose are implanted at positive and negative values of the tilt angle with respect to a plane perpendicular to the substrate. In ion implantation with a zero tilt angle, referred to as ion implantation without a tilt, the total dose is implanted in a single step.

An LDD process sequence may include an N-type Lightly Doped Drain (NLDD) process sequence and/or a P-type Lightly Doped Drain (PLDD) process sequence. In an example NLDD process sequence, a patterned masking layer, such as a layer of photoresist, may be deposited and patterned according to an NLDD pattern, covering p-FinFET structures and exposing n-FinFET structures. NLDD regions for n-FinFETs are then formed by implanting n-type dopants, which act as donors. For example, one or more of phosphorous, arsenic, antimony, or other n-type dopants may be implanted as NLDD dopants to form NLDD regions. Such implantations are referred to as NLDD implants. Following NLDD implantation, the patterned photoresist layer may be removed and an NLDD anneal may be performed to activate the dopants. In an example PLDD process sequence, a patterned masking layer, such as a layer of photoresist may be deposited and patterned according to a PLDD pattern, covering n-FinFET structures and exposing p-FinFET structures. PLDD regions for p-FinFETs are then formed by implanting p-type dopants, which act as acceptors. For example, one or more of boron, $BF_2$, indium, or other p-type dopants may be implanted as PLDD dopants to form PLDD regions. Such implantations are referred to as PLDD implants. Following PLDD implantation, the patterned photoresist layer may be removed and a PLDD anneal may be performed to activate implant species. In the absence of LDD implants, the sharp change in doping concentration between the channel and the source-drain regions of a transistor can lead to the generation of deleterious hot electrons. LDD implants are commonly employed to provide a more smooth transition in the doping concentration between the channel and the source-drain regions. The NLDD process sequence may be performed before or after the PLDD process sequence. In addition, other process steps may be performed between the NLDD and PLDD process sequences. For example, a sidewall may be formed following the NLDD process sequence and prior to the PLDD process sequence to affect the location of PLDD dopants advantageously. Furthermore, in lieu of separate NLDD and PLDD anneal steps, a single LDD anneal may be used to activate both PLDD and NLDD dopants. In various example processes, one or more anneal steps may be Rapid Thermal Anneal (RTA), spike RTA, laser anneal, or the like. The terms MDD (Moderately Doped Drain), NMDD, and PMDD are sometimes used in lieu of the terms LDD, NLDD, and PLDD, to indicate that the doping concentrations used in a given process are somewhat higher than historically low levels used in past technology generations. Other terms, such as drain extensions, may also be used.

In embodiments disclosed herein, ion implantation is performed to advantageously affect strain in FinFET channel regions. Such implantation is herein referred to as strain implantation.

FIGS. 6A and 6B are simplified cross-sectional illustrations of selected p-FinFET structures following an embodiment of strain implantation in a PLDD process sequence. In this embodiment, strain implantation is performed while the PLDD photoresist pattern is in place. Thus, an advantage of this embodiment is it requires no additional patterning step, reducing cost and process complexity. In addition, the combination of the gate stack 140 and the spacer 540 acts as a masking feature for the implantation. In various embodiments, strain implantation may be performed before or after any of the one or more PLDD implants performed in a PLDD process sequence. In an embodiment, the material for the fins 110 is Si and the implant species for strain implantation is also Si. Si may be implanted, for example, using $SiF_4$ as the implantation gas. Implant species enter some upper fin regions 610 of the fins 110, some upper isolation regions 630 of the isolation regions 130, and an upper stack region 640 of the gate stack 140. Any implant species entering portions of the spacer 540 disposed on the sidewalls of the gate stack 140 and on the sidewalls of the fins 110 are not depicted in figures herein for simplicity.

In an embodiment, a single anneal step is employed to anneal both PLDD and strain implants. This embodiment is advantageous because it requires no additional anneal step for the strain implantation. In an embodiment, a single spike RTA at 850° C. may be employed as a common anneal for both PLLD and strain implants. The anneal step has several effects. First, implant species diffuse outward from the implanted areas into neighboring regions during the anneal. If strain implantation is performed without tilt, as indicated in FIGS. 6A and 6B by vertical arrows, implant species are blocked from entering the channel region 550 by the gate stack 140 and portions of the spacer 540 disposed on the sidewalls of the gate stack 140, except by lateral straggle. During the anneal, they diffuse toward and into the channel region 550. If strain implantation is conducted with a non-zero tilt angle in the direction of channel length, a larger number of implant species enter farther into the channel region 550 prior to anneal, and then further diffuse therein during the anneal. The extent to which implant species enter the channel region 550 thus depends on parameters such as the implant tilt angle and the anneal time and temperature, among others. Likewise, Si atoms implanted into the upper portions of the isolation regions 130 diffuse toward and into lower fin portions 655 of the fins 110. Moreover, Si atoms implanted into the upper portions of the isolation regions 130 diffuse into un-implanted regions of the isolations regions 130 lying under the gate stack (not apparent in the cross sectional views of FIGS. 6A and 6B). Second, many implant species occupying interstitial positions prior to the anneal bond with nearby atoms and are thus incorporated into the crystal structure during the anneal, thus increasing the level of strain in the implanted areas and therefore the level of stress applied to neighboring regions. Third, significant crystal damage caused by strain implantation is partially repaired by the anneal step.

Strain implantation of Si produces compressive strain in the p-FinFET channel region 550. This strain, represented in FIG. 6A by arrows 625, exists in the cross-sectional plane of FIG. 6A, decreases in magnitude below the regions 610, and is substantially in the direction of channel length. An advantage of this strain is that it improves the performance of the p-FINFET, because compressive strain along the channel length direction increases hole mobility.

Strain implants in the upper isolation regions 630 also produce strain, but most of this strain occurs in areas lower than the channel region 550. Since most current flow occurs in the channel region, the impact of the strain implant in the regions 630 on transistor performance is relatively smaller. Nevertheless, a brief description of strain components resulting from strain implants in the upper isolation regions 630 is presented herein. In a simplified two-dimensional description, two such strain components may be identified. A first compressive strain component occurs in a direction substantially along the fin width and reduces the mobility of holes in areas where it is present. This component, represented by arrows 633 in FIG. 6B and by markers 635 in FIG. 6A, exists in the cross-sectional plane of FIG. 6B and in front of and behind the cross-sectional plane of FIG. 6A. Moreover, the fin material is compressed both inward and outward of the direction of view in FIG. 6A, originating both from the regions 630 behind the cross-sectional plane of FIG. 6A and from the regions 630 in front of it. A second compressive strain component occurs in a direction substantially along the channel length and increases the mobility of holes in areas where it is present, counteracting the first component. This component, represented by arrows 638 in FIG. 6A, exists in front of and behind the cross-sectional plane of FIG. 6A.

Figure 7:
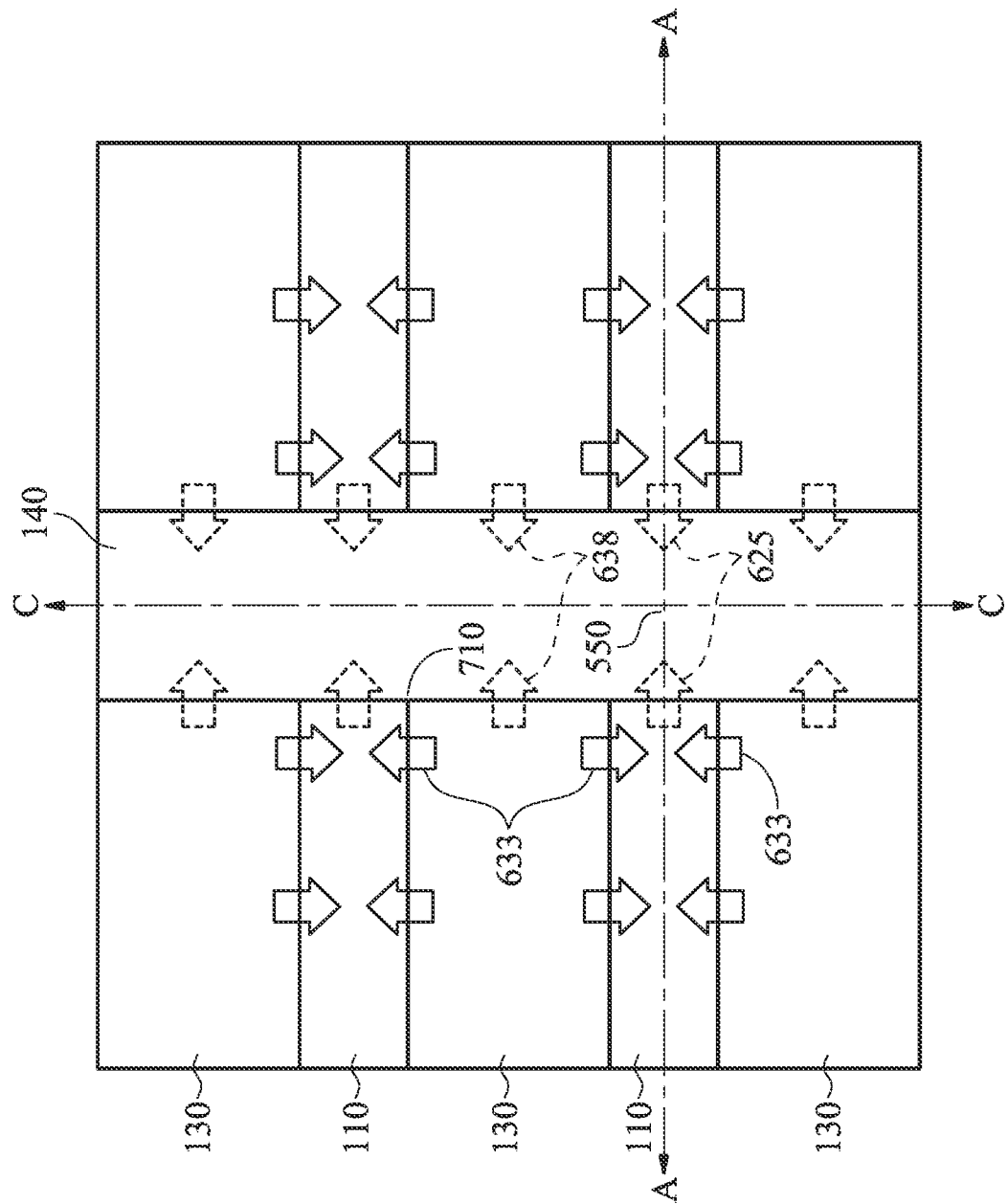
FIG. 7 is a plan-view illustration of stress components in a p-FinFET structure following an embodiment of strain implantation in a PLDD process sequence.

Stress components described above may be further elucidated in a plan-view illustration. FIG. 7 is a plan-view illustration of stress components in a p-FinFET structure following an embodiment of strain implantation in a PLDD process sequence. The isolation regions 130 isolate the fins 110, which are in turn partially covered by the gate stack 140. Lines A-A and C-C of FIG. 7 correspond to lines A-A and C-C in FIG. 1, respectively. Compressive strain in FinFET channels, represented by the arrows 625, results from strain implantation in the upper regions of the fins 110, increasing hole mobility and enhancing transistor performance. Note that arrows 625 are illustrated with dotted lines in the plan view, to recognize that the strain occurs within the channel region of the fin 110 and not at the top of the dummy gate stack 140 shown in FIG. 7. Compressive strain, represented by arrows 633 and 638, occurs in areas lower than the channel 550, but has a relatively smaller effect on transistor performance. It is recognized herein that at locations such as near a corner 710 of an implanted area of isolation regions 130, total strain has components in both the directions represented by the arrows 633 and 638, reflecting the simplified nature of the two-directional description herein.

Referring to FIG. 6A, another advantage of the present embodiment of strain implantation is enlargement of the upper stack region 640. In some embodiments, a width of the top portion of the gate stack is enlarged by about 6% to about 10%, for instance. Portions of the spacer 540 disposed on the sidewalls of the gate stack 140 are sloped outward under the stress applied to them by strain implantation in the upper stack region 640. Although FIG. 6A depicts the slope of the spacer 540 as substantially linear, the slope may have a non-linear shape. Enlargement of the upper stack region 640 offers several advantages. These advantages will be described further below in conjunction with FIGS. 11A and 12A.

FIGS. 8A and 8B are simplified cross-sectional illustrations of selected p-FinFET structures following source-drain recess in an example FinFET manufacturing process including an embodiment of strain implantation in a PLDD process sequence. A second spacer 830 may have been disposed on the first spacer 540 on the sidewalls of the gate stack 140 and on the fins 110 prior to this stage of the manufacturing process. Since the second spacer 830 is disposed on the first spacer 540, portions of the second spacer 830 disposed on the sidewalls of the gate stack 140 are sloped outward in the present embodiment of strain implantation.

While n-FinFET structures are covered and p-FinFET structures are exposed by a masking sequence, regions 810 of the fins 110 are removed down to a recess level 820. Portions of the first and second spacers 540 and 830 may also be removed. The regions 810 are intended to serve as source or drain for p-FinFET transistors after subsequent process steps. An advantage of the present embodiment is that crystal damage in the regions 810, resulting from strain implantation and remaining after anneal, is removed in the source-drain recess step.

Implant species that have entered the channel region 550 during the implant and anneal processes, as well as implant species in any portions of the fins 110 remaining between the regions 810 and the channel region, are not removed in the source-drain recess process. The implant species provide compressive strain and thus mobility enhancement in the channel region. In some manufacturing processes, regions 840 of the fins 110, not covered by gate stacks, are not removed in the source-drain recess step. Such regions, herein referred to free full-fin regions, contain substantially all of the implant species implanted therein during the strain implantation step. By this stage of the manufacturing process, portions of the upper isolation regions 630 may have been removed, leading to a reduction in strain components in areas below the channel region 550. In some embodiments, the upper isolation regions 630 may be substantially or entirely removed.

FIGS. 9A and 9B are simplified cross-sectional illustrations of selected p-FinFET structures following deposition of the first inter-level dielectric in an example FinFET manufacturing process including an embodiment of strain implantation in a PLDD process sequence. P-FinFET source-drain structures 910 are produced in the regions 810 of FIG. 8A, for example by epitaxial growth. As shown in FIG. 9B, epitaxial source-drain structures grown on adjacent fins 110 may join to form a connected feature, with an air gap 920 forming underneath. Source-drain regions may be doped during growth or thereafter. They may have dopant concentration of between about $10^{19}$ cm$^{-3}$ and about $10^{21}$ cm$^{-3}$. Dopants used to form n-FinFET source-drain regions may be phosphorus, arsenic, antimony, or the like. While dopants used to form p-FinFET source-drain regions may be boron, BF$_2$, indium, or the like.

In some embodiments, the material for the source-drain structures 910 may be substantially the same as the material of the fins 110. In other embodiments, a different material may be chosen to exert compressive stress on the channel region 550. Accordingly, if the fins 110 are silicon, the regions 910 may comprise Si, or materials such as silicon germanium, Ge, silicon germanium boron, germanium tin, or the like. In such embodiments, the total strain in the channel region 550 may be due to both strain implantation and the source-drain regions 910. Mobility improvements due to stress applied by the source-drain regions may thus be enhanced by strain implantation.

Similar method may be employed to produce source-drain structures for n-FinFETs. In some embodiments, the material for source-drain features may be substantially the same as the material of the fins. In other embodiments, a different material may be chosen to exert tensile stress on n-FinFETs channel regions. Accordingly, if the fins are Si, source-drain regions may comprise Si, or materials such as silicon carbide, silicon phosphorous, silicon carbon phosphorous, or the like. In embodiments comprising strain implantation for n-FinFETs, the total strain in the n-FinFET channel region will be due to both strain implantation and the n-FinFETs source-drain regions. Mobility improvements due to stress applied by the source-drain regions may thus be enhanced by strain implantation.

Following the manufacturing of source-drain regions, a first Inter-Level Dielectric (ILD) 940 may be deposited on FinFET structures. The first ILD 940 may be or include Phospho-Silicate Glass (PSG), Boro-Silicate Glass (BSG), Boron-Doped Phospho-Silicate Glass (BPSG), undoped Silicate Glass (USG), or the like, and it may be deposited by any suitable method, such as Chemical Vapor Deposition (CVD), plasma-enhanced CVD (PECVD), or FCVD. In some embodiments, a contact etch stop layer (CESL) 930 is disposed on FinFET structures prior to the deposition of the first ILD. The CESL 930 may comprise a dielectric material, such as, silicon nitride, silicon oxide, silicon oxynitride, or the like, having a different etch rate than the material of the overlying first ILD 940. In an embodiment of strain implantation, portions of the CESL 930 disposed on the sidewalls of the gate stack 140 may be sloped outward.

Figure 10B:
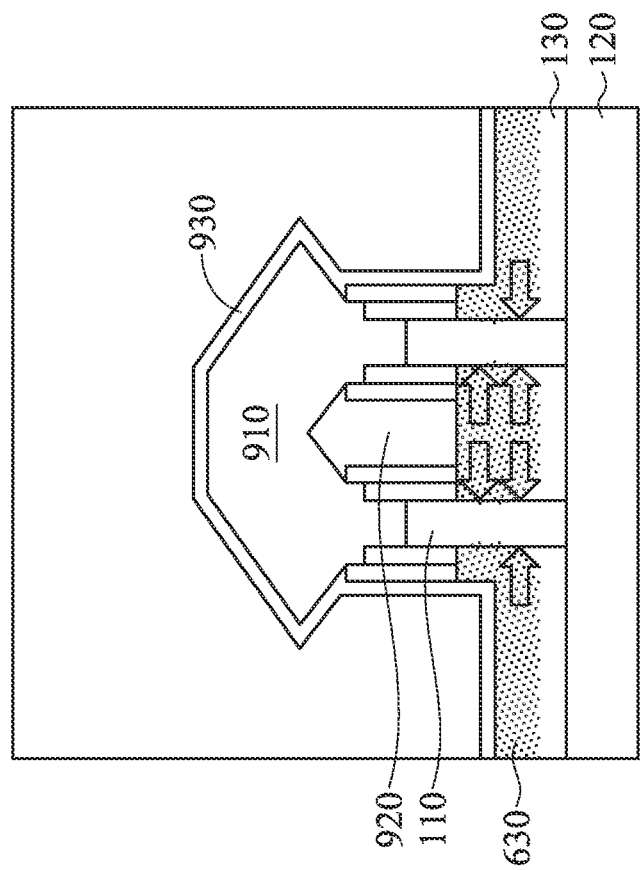
FIGS. 10A and 10B are simplified cross-sectional illustrations of selected p-FinFET structures following removal of a gate stack in an example FinFET manufacturing process including an embodiment of strain implantation in a PLDD process sequence.
Figure 10A:
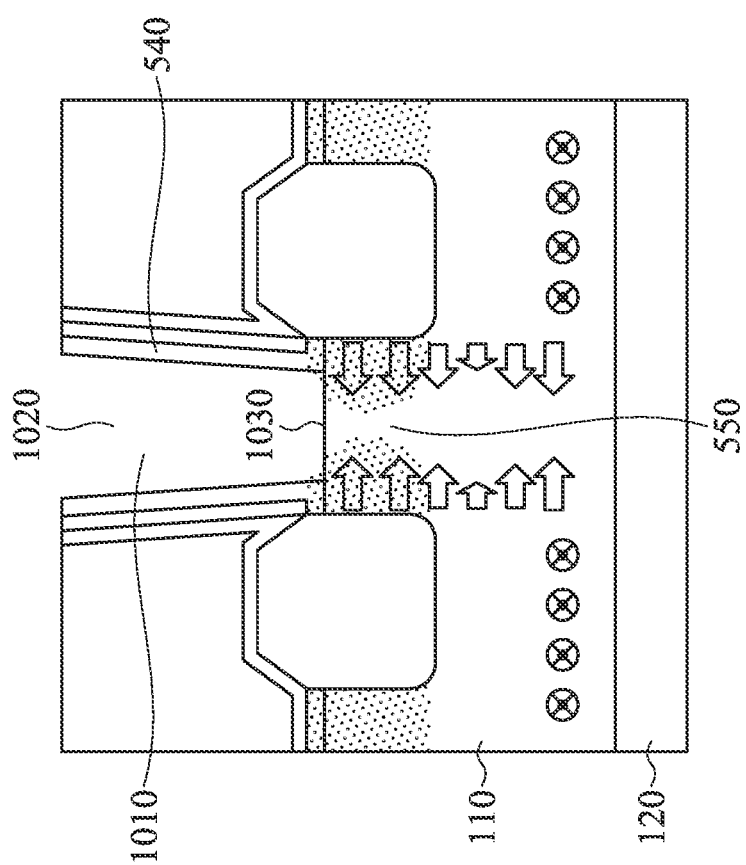

FIGS. 10A and 10B are simplified cross-sectional illustrations of selected p-FinFET structures following removal of a gate stack in an example FinFET manufacturing process including an embodiment of strain implantation in a PLDD process sequence. A planarization process such as CMP may be performed to planarize the top surface of the wafer and to provide access to the gate stack 140 for its removal. The planarization process may be stopped at the top surface of the gate stack 140, leaving the gate stack in place substantially in its entirety, or it may remove upper portions of the gate stack 140 and the first and second spacers 540 and 830 along the sidewalls of the gate stack 140. Any material of the gate stack 140 remaining after planarization may then be removed, for example by selective etching, leaving behind a cavity 1010 bordered on the sides by the spacer 540. The first gate dielectric (not shown) disposed on the fin 110 may be left in place, or it be fully or partially removed from the cavity 1010 for all transistors or only for transistors intended to operate in specific voltage ranges. In an embodiment of strain implantation, a top width 1020 of the cavity 1010 is larger than a bottom width 1030 of said cavity.

Figure 11B:
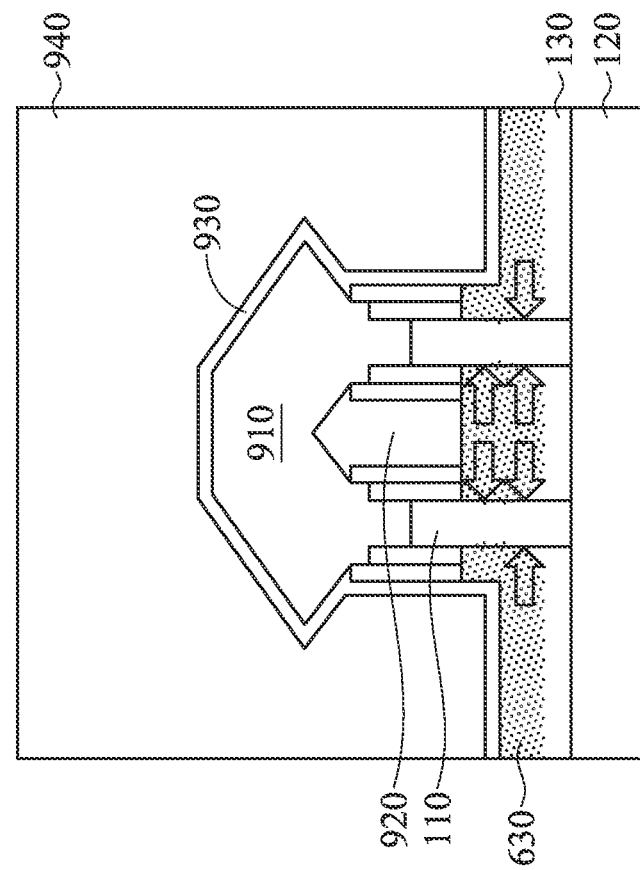
FIGS. 11A and 11B are simplified cross-sectional illustrations of selected p-FinFET structures following formation of a replacement gate in an example FinFET manufacturing process including an embodiment of strain implantation in a PLDD process sequence.
Figure 11A:
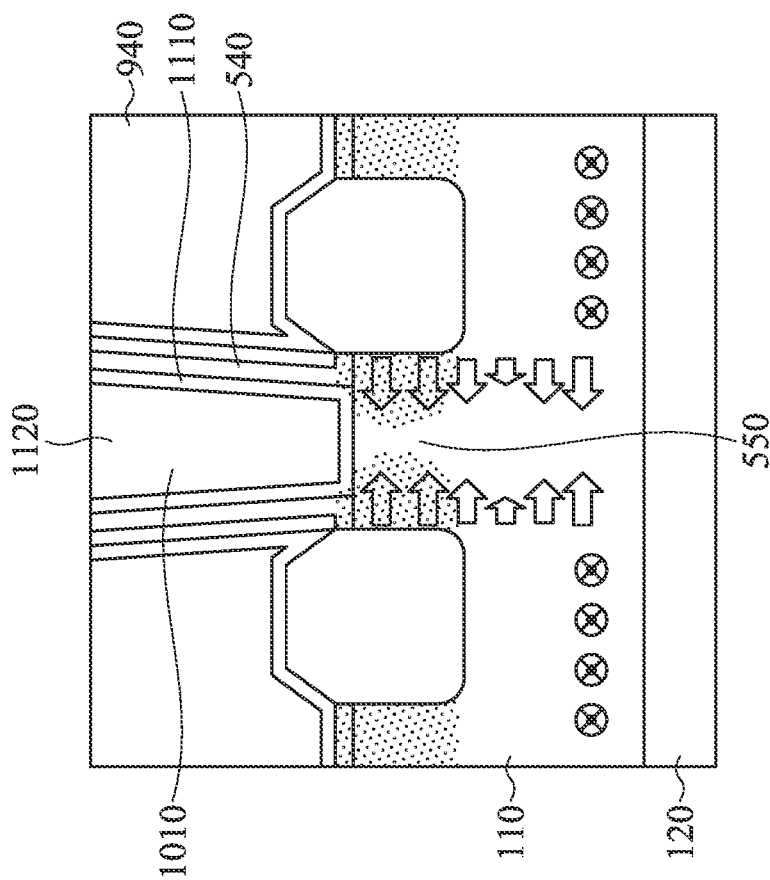

FIGS. 11A and 11B are simplified cross-sectional illustrations of selected p-FinFET structures following formation of a replacement gate in an example FinFET manufacturing process including an embodiment of strain implantation in a PLDD process sequence. A second gate dielectric 1110 may be disposed in the cavity 1010. The dielectric 1110 may be deposited conformally on the wafer, and it may comprise silicon oxide, silicon nitride, or multilayers thereof. In some manufacturing processes, the dielectric 1110 may include a high-k dielectric material having a k value greater than about 7.0, and may include a metal oxide or a silicate of Hf, Al, Zr, La, Mg, Ba, Ti, Pb, or combinations thereof. The dielectric 1110 may be deposited by Molecular-Beam Deposition (MBD), Atomic-Layer Deposition (ALD), PECVD, or the like. An advantage of the present embodiment of strain implantation is that the sloped profile of the spacer 540 facilitates conformal deposition of the dielectric 1110. The dielectric 1110 may also be sloped outward.

In a process referred to as filling, a replacement gate 1120 may be deposited over the gate dielectric 1110, and may include a metal-containing material such as TiN, TiO, TaN, TaC, Co, Ru, Al, W, combinations thereof, or multi-layers thereof. Although the replacement gate 1120 is illustrated in FIG. 11A without detail, it may comprise any number of liner layers and work-function tuning layers. Referring to FIG. 10A, another advantage of strain implantation in a PLDD process sequence is that the enlarged top width 1020 of the cavity 1010 increases the overall volume of the gate 1120 for the same depth, thus beneficially reducing the electrical resistance of the replacement gate. Reducing the resistance of the gate increases circuit speed. In another advantage, the enlarged top width 1020 facilitates the filling process, reducing the probability of formation and the size of any voids within the replacement gate. Voids are deleterious because they increase the electrical resistance of the gate, this degrading circuit speed.

Following the deposition of material for the gate 1120, portions of the second gate dielectric 1110 and the replacement gate 1120 deposited on the top surface of the first ILD 940 may be removed in a planarization step, yielding the structure illustrated in FIGS. 11A and 11B. It is contemplated herein that in some manufacturing processes, replacement gates and dielectric layers associated with them may not be the same for n-FinFET and p-FinFET transistors. In such processes, appropriate masking methods are used to enable the disposition of different materials for n-FinFET and p-FinFET transistors.

FIGS. 12A and 12B are simplified cross-sectional illustrations of selected p-FinFET structures following formation of contacts in an example FinFET manufacturing process including an embodiment of strain implantation in a PLDD process sequence. A second ILD 1210 is deposited on the first ILD 940. The second ILD 1210 may be a dielectric material such as PSG, BSG, BPSG, USG, or the like, it may be flowable, and it may be deposited by any suitable method, such as CVD and PECVD or FCVD. Openings for source-drain contacts 1220 may be formed through the second and first ILD's 1210 and 940 and the CESL 930. In some manufacturing processes, a gate cover (not shown) may be present on the replacement gate 1120. Openings for gate contacts 1230 are formed through the second ILD 1210, and through the gate cover if present. The openings may be formed using acceptable photolithography and etching techniques. One or more liners (not shown) may be formed in the openings, such as diffusion barrier layers, adhesion layers, or the like. A liner may include titanium, titanium nitride, tantalum, tantalum nitride, or the like. Conductive materials for the source-drain contacts 1220 and gate contacts 1230 may be disposed in their respective openings. Conductive materials for contacts may be copper, a copper alloy, silver, gold, tungsten, cobalt, aluminum, nickel, or the like. A planarization process, such as a CMP, may then be performed to remove excess materials from a surface of the second ILD 1210. An anneal process may be performed to form a silicide at the interface between the source-drain regions 910 and the source-drain contacts 1220. The source-drain contacts 1220 and gate contacts 1230 may be formed in separate process sequences, or may be formed in the same process sequence.

Although source-drain contacts 1220 and gate contacts 1230 are all shown in the cross section illustrated in FIG. 12A, it should be appreciated that in some manufacturing processes, some or all such contacts may be present not in the cross section of FIG. 12A, but in front of or behind it. Furthermore, the slopes illustrated in FIGS. 12A and 12B for the sidewalls of the contacts 1220 and 1230 are not intended to employ any relationship of equality or inequality among said slopes or between said slopes and slopes of other structures in the figures, such as the sidewalls of the gate 1120.

Two additional advantages of the present embodiment of strain implantation may be described in relation to FIG. 12A. First, an upper width 1240 of the gate 1120 is larger than a lower width 1250 of said gate. The larger upper width 1240 is available for electrical connection between the gate 1120 and the gate contact 1230, beneficially reducing the resistance of the connection if the gate contact 1230 is also sized accordingly. Second, an interconnect layer (not shown) is commonly deposited over the second ILD 1210 to allow interconnection of various terminals to form a circuit. Since the present embodiment facilitates the filling process for the gate 1120, it enables the production of a taller gate 1120 and thus a larger vertical distance between said interconnect layer on the one hand and the substrate and FinFET structures on the other. This larger distance reduces the capacitance between said structures. In some cases, taking advantage of this opportunity to reduce the capacitance may provide a net increase in circuit speed.

Since process steps subsequent to formation of contacts primarily involve formation of structures above the second ILD 1210, FIGS. 12A and 12B are also simplified cross-sectional illustrations of selected p-FinFET structures upon completion of the circuit manufacturing process. Referring to FIG. 12B, stress-implanted atoms may be disposed in the channel region 550, the free full-fin regions 840, any portion (not shown) of fin remaining between the source-drain regions 910 and the channel region 550. Referring to FIG. 12B, stress-implanted atoms may be disposed in the upper isolation regions 630. Atoms of constituent elements of said regions are disposed therein. A constituent element of a material is defined herein as any element present in said material constituting more than about 20% of the material by atomic concentration. Atoms of constituent materials are herein referred to as constituent atoms. For example, if the channel region 550 is $Si_{0.8}Ge_{0.2}$, constituent Si and Ge atoms are disposed in said channels, at a ratio of about four to one. If the composition of a channel region is not constant in the vertical direction, the vertical concentration profiles of constituent Si and Ge atoms reflect the vertical profile of the composition. Likewise, in an isolation region composed of substantially stoichiometric $SiO_2$, constituent Si and oxygen atoms are disposed, at a ratio of about one to two. In addition, donor or acceptor dopants may be disposed in such regions. In a p-FinFET channel region, for example, dopants such as boron or indium may be disposed. As noted above, in embodiments of stress implantation, atoms resulting from stress implantation may also be disposed in various regions. Such atoms, entering said regions during stress implantation, or diffusing into said regions during a subsequent anneal, are herein referred to as excess atoms. Excess atoms may be interstitial, or bonded to other atoms. In embodiments where the stress implant species is different from the constituent elements, as in the case of a nitrogen stress implant and a $Si_{0.8}Ge_{0.2}$ channel, excess atoms may be distinguished by their chemical species, their concentration profile, or the presence of any interstitial atoms. Concentration profiles of implanted profiles depend on the implant species, the material into which implant species are implanted, implantation energy, dose, and tilt angle. Such concentration profiles commonly exhibit a peak at a specific depth, referred to as the range, and are sometimes approximated by a Gaussian function in laterally uniform cases. Anneal steps alter the as-implanted concentration profile through diffusion, depending on the temperature-time profiles of the anneal and the diffusion coefficients of the diffusing species in the host material. Numerical modeling and simulation are commonly employed to calculate as-implanted and post-anneal profiles for various implants. Measurement techniques such as Secondary Ion Mass Spectrometry (SIMS) and nano-SIMS are commonly used for measure such profiles. Implanted atoms are commonly interstitial, and although many assume lattice positions upon anneal, some may remain interstitial. Thus, presence of any interstitial atoms may also indicate the presence of excess atoms. In embodiments where the stress implant species is the same as a constituent element, as in the case of a silicon stress implant into a silicon or a $Si_{0.8}Ge_{0.2}$ channel, excess atoms may be distinguished by their concentration profile, or by the presence of any interstitial atoms.

In various embodiments of strain implantation, a concentration of excess atoms in the channel region 550 is in the range between about $10^{19}$ cm$^{-3}$ and about $10^{20}$ cm$^{-3}$. In other embodiments, a concentration of excess atoms in the upper isolation region 630 is in the range between $10^{20}$ cm$^{-3}$ and about $10^{21}$ cm$^{-3}$. In still other embodiments, an area concentration of excess atoms in the free full-fin regions 840 is about the strain implantation dose. In an embodiment, for example, said areal concentration is in the range between $10^{15}$ cm$^{-2}$ and about $10^{17}$ cm$^{-2}$ for a p-FinFET.

FIG. 13 is a table containing implantation parameters for some embodiments of strain implantation in FinFETs. Embodiments shown in FIG. 13 are applicable to FinFETs wherein the fin material is any group-IV elemental or group-IV compound semiconductor, including for example $Si_{1-x}Ge_x$ with the germanium content x in the range between zero and 100% (including Si and Ge), $Si_{1-x-y}Ge_xC_y$, or the like. In an embodiment for p-FinFETs, $SiF_4$ gas is used to implant Si into a p-FinFET, at a dose in the range between about $10^{15}$ and about $10^{17}$ cm$^{-2}$, a tilt angle in the range between zero and 30 degrees, and an implantation energy in the range between about 5 and about 30 KeV. In another embodiment, $SiF_4$ gas is used to implant silicon, at a dose in the range between about $10^{15}$ and about $10^{17}$ cm$^{-2}$ and a tilt angle in the range between zero and about 30 degrees, and the implantation energy is selected to results in an implant range R in the range between about 20 to about 40 nanometers. In other embodiments for p-FinFETs, $GeF_4$ gas or $N_2$ gas are used to implant Ge or nitrogen, respectively.

In still other embodiments, strain implantation is used to increase electron mobility in n-FinFET channels. In one embodiment, $CO_2$ is used as the carbon-containing gas to implant carbon into an n-FinFET, at a dose exceeding $10^{17}$ cm$^{-2}$, a tilt angle in the range between zero and 30 degrees, and an implantation energy less than about 15 keV. In another embodiment, $CO_2$ is used as the carbon-containing gas to implant carbon into an n-FinFET, at a dose exceeding about $10^{17}$ cm$^{-2}$, a tilt angle in the range between zero and about 30 degrees, and the implantation energy is selected to results in an implant range R in the range between about 20 to about 40 nanometers. In still other embodiments, $N_2$ gas is used to implant nitrogen into an n-FinFET.

In the embodiment shown in FIG. 6A, the spacer 540 is present on the fins 110 and on the sidewalls of the gate stack 140 during strain implantation. In various other embodiments, the spacer 540, multiple spacers, or other layers, each may or may not be present on the fins 110 or on the sidewalls of the gate stack 140 during strain implantation. It is contemplated herein that in some embodiments, strain implantation parameters such as dose, energy, and tilt angle described below are suitably adjusted to ensure that after anneal steps, implant species are disposed in the channel region 550 in advantageous concentrations described above.

In some embodiments, the fin material is a III-V compound semiconductor and one or more elements of the groups IIIA and VA of the periodic table are used as implant species. For example, the fin material may be GaAs and the implant species may be nitrogen, phosphorous, arsenic, aluminum, gallium, and/or indium. In some embodiments, approximately equal doses of an element from group IIIA and an element from group VA may be implanted at approximately the same implant range to maintain fin stoichiometry. For example, fin material may be GaAs and a group-IIIA element such as nitrogen, phosphorous, or arsenic, and a group-VA element such as aluminum, gallium, or indium may be implanted at approximately equal dose and implant range.

In various embodiments, an anneal step employed to anneal the strain implant may be any anneal process compatible with the FinFET manufacturing process, including RTA, spike RTA, laser anneal, or the like. In an embodiment, a single anneal step is used to anneal both the strain and PLDD implants. In others embodiments, a separate strain anneal step is performed for strain implantation. If, for example, the PLDD anneal employed in a FinFET manufacturing process is at lower temperature, shorter duration, or both, compared to the anneal for strain implantation, the strain anneal may be performed first. In an embodiment, PLDD patterning of photoresist is followed by strain implantation for p-FinFETs, photoresist removal, a strain anneal, a second application and PLDD patterning of photoresist, PLDD implantation, removal of second photoresist, and a PLDD anneal. In another embodiment, the second patterning step is avoided by using a hard mask: a PLDD photoresist is used to pattern a hard mask, and strain implantation for p-FinFETs, strain anneal, PLDD implantation, and PLDD anneal, and hard mask removal follow. Similar embodiments may be used for n-FinFETs. Other embodiments are also possible. For example, strain implants for one or both p-FinFETs and n-FinFETs may be performed prior to the LDD process sequence, and one or more strain anneal steps may be formed to anneal strain implants for both p-FinFETs and n-FinFETs individually or together.

In some embodiments, strain implantation may be tilted in the direction of fin width with or without any tilt in the direction of channel length. Referring to FIG. 6B, in the absence of any tilt in the direction of fin width, implanted atoms may not reach areas of the fins 110 below the upper fin regions 610. However, if an implant is tilted in the direction of fin width, implanted atoms may reach areas of the fins 110 below the upper fin regions 610 and advantageously mitigate any reduction in strain in the lower reaches of the channel region 550. In some embodiments, a portion of the total strain implantation dose is implanted with a non-zero tilt in the direction of fin width. In some embodiments, strain implantation is performed without tilt in the direction of channel length and with tilt in the direction of fin width. In such an embodiment, strain implantation is performed in three steps. A portion of the total dose is implanted without tilt in a first step. The remainder of the total dose is then divided into two halves and implanted in two steps at positive and negative values of tilt in the direction of fin width. In other embodiments, strain implantation may be performed with tilt both in the direction of channel length and that of fin width. In such an embodiment, a portion of the total dose is implanted in two steps at positive and negative values of tilt in the direction of channel length, and the remainder of the total dose is implanted in two additional steps, at positive and negative values of tilt in the direction of fin width. In some embodiments, a tilt angle in the direction of fin width is in the range between zero and about 30 degrees.

In some embodiments, strain implantation for p-FinFETs may be performed at stages of the FinFET manufacturing process other than the PLDD or NLDD stages. In an embodiment, for example, strain implantation is performed following source-drain recess and prior to source-drain epitaxy. As illustrated in FIG. 8A, source-drain recess allows direct access to sidewalls 850 of the channel region 550. Strain implantation may be conducted with a tilt in the direction of channel length to dispose implant species into the channel region 550. Moreover, in comparison to strain implantation in an LDD process sequence, a lower implant dose may be employed. An anneal step is then performed to enhance strain and repair implant damage prior to source-drain epitaxy. In other embodiment, strain implantation may be performed following source-drain epitaxy.

Figure 14:
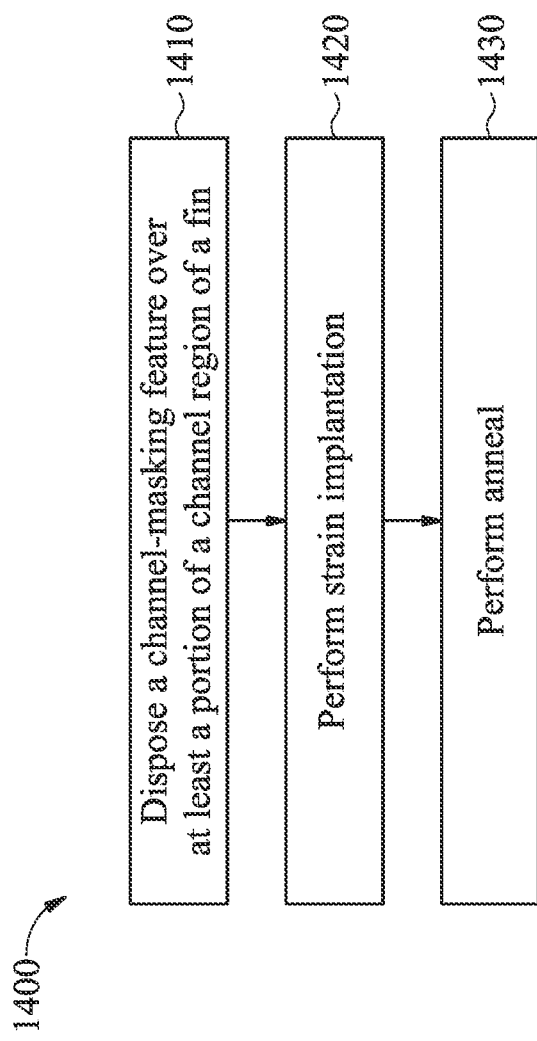
FIG. 14 is a flowchart of an embodiment of a method for strain implantation.

FIG. 14 is a flowchart of an embodiment of a method for strain implantation. In a step 1410, a channel-masking feature is disposed over a first portion of a fin and not over a second portion of the fin, the first portion disposed over at least a portion of the channel region. The channel-masking feature may or may not comprise a gate, such as a dummy gate or a replacement gate, and it may or may not comprise one or more sidewalls. The channel-masking feature may be or comprise photoresist, silicon nitride, silicon oxide, or the like. A width of the channel-masking feature may not be equal to a width of the channel region, the feature extending outside the channel region, or not masking the entire channel region. In a step 1420, strain implantation is performed. The channel-masking feature blocks at least some implant species from entering the channel region. In a step 1430, an anneal is performed.

Figure 15:
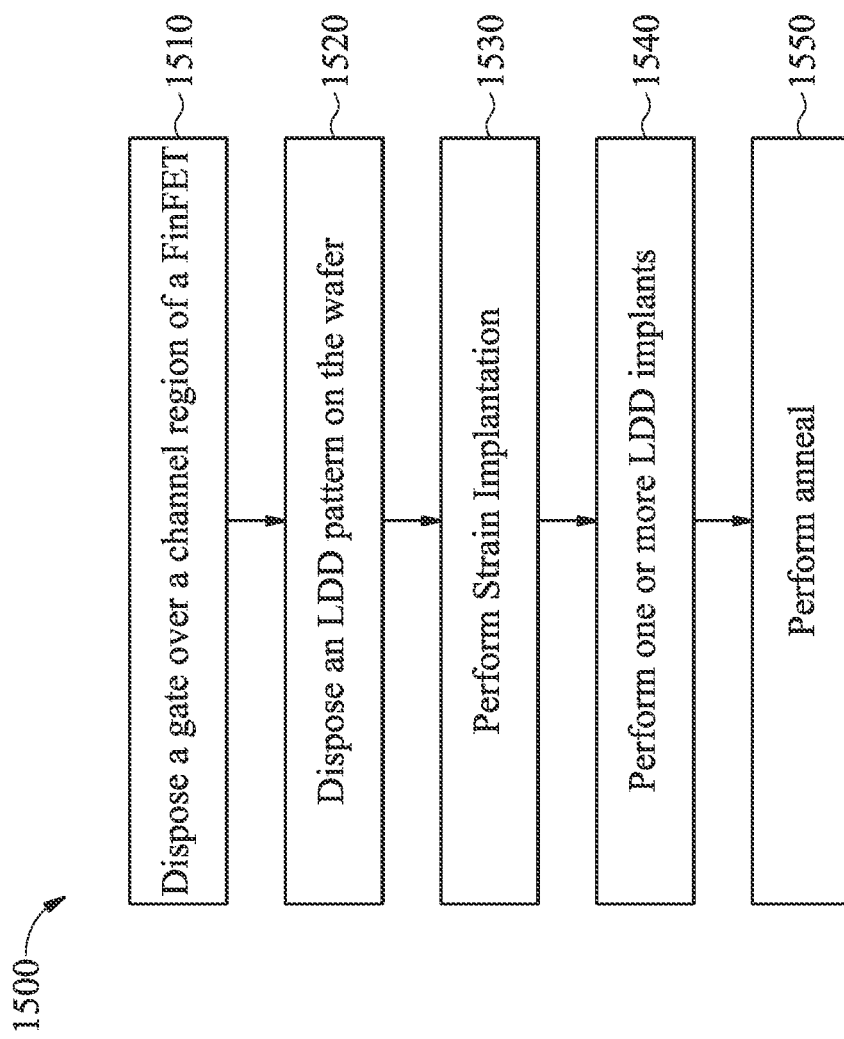
FIG. 15 is a flowchart of an embodiment of a method for strain implantation at an LDD stage.

FIG. 15 is a flowchart of an embodiment of a method for strain implantation at an LDD stage. The LDD stage may be an NLDD or a PLDD stage, and the method may be applied at the NLDD stage for n-FinFETs, the PLDD stage for p-FinFETs, or at both stages for n- and p-FinFETs, respectively. In a step 1510, a gate is disposed over a channel region of a fin. The gate may be a dummy gate or a replacement gate. In a step 1520, a patterned masking layer is disposed on the wafer according to an LDD pattern. The masking layer may be photoresist. In a step 1530, strain implantation is performed. One or more LDD implants are performed in a step 1540, and an anneal is performed in a step 1550. If the masking layer is photoresist, it may be removed prior to the anneal step 1550.

In other method embodiments, the order of steps 1530 and 1540 may be reversed. More generally, strain implantation may be performed after any of the one or more LDD implants. In still other method embodiments, anti-reflection coatings or planarization layers may be used together with the photoresist. In yet other embodiments, one or more hard mask layers, such as an oxide or a nitride layers, may be used to mask the implants, and photoresist may or may not be removed after the one or more mask layers are patterned. Any mask layers may be removed before or after the anneal step 1550.

In an embodiment, a transistor includes a channel region containing a constituent element and excess atoms, the constituent element belonging to a group of the periodic table of elements, wherein said excess atoms are nitrogen, or belong to said group of the periodic table of elements, and a concentration of said excess atoms in the channel region is in the range between about $10^{19}$ cm$^{-3}$ and about $10^{20}$ cm$^{-3}$. In an embodiment, the transistor, wherein the channel region is an elemental group-IVA or compound group-IVA semiconductor, the transistor is a p-FinFET, and the excess atoms are Si. In an embodiment, the transistor, wherein the channel region is an elemental group-IVA or compound group-IVA semiconductor, the transistor is a p-FinFET, and the excess atoms are Ge. In an embodiment, the transistor, wherein the channel region is an elemental group-IVA or compound group-IVA semiconductor, the transistor is a p-FinFET, and the excess atoms are nitrogen. In an embodiment, the transistor, wherein the channel region is an elemental group-IVA or compound group-IVA semiconductor, the transistor is an n-FinFET, and the excess atoms are carbon. In an embodiment, the transistor, wherein the channel region is an elemental group-IVA or compound group-IVA semiconductor, the transistor is an n-FinFET, and the excess atoms are nitrogen. In an embodiment, the transistor, wherein the channel region is a III-V compound semiconductor, and said excess atoms are nitrogen, or belong to groups IIIA or VA of the periodic table of elements.

In an embodiment, a transistor includes a gate, wherein an upper width of the gate is larger than a lower width of the gate by a value exceeding about 1 nanometer, a channel region containing a constituent element and excess atoms, the constituent element belonging to a group of the periodic table of elements, wherein said excess atoms are nitrogen, or belong to said group of the periodic table of elements, and a concentration of said excess atoms in the channel region is in the range between about $10^{19}$ cm$^{-3}$ and about $10^{20}$ cm$^{-3}$. In an embodiment, the transistor is a FinFET. In an embodiment, a concentration of said excess atoms in an isolation region is in the range between about $10^{20}$ cm$^{-3}$ and about $10^{21}$ cm$^{-3}$. In an embodiment, an area concentration of said excess atoms in a free full-fin region is at least $10^{15}$ cm$^{-2}$.

In an embodiment, a method of manufacturing a FinFET including a channel region containing a constituent element belonging to a group of the periodic table of elements, the method including covering a first portion of a fin by disposing a channel-masking feature over said first portion, and leaving a second portion of the fin uncovered by said channel-masking feature, said first portion including at least a portion of the channel region, performing a first ion implantation of nitrogen, or of an element belonging to said group of the periodic table of elements, and annealing said ion implantation. In an embodiment, the method, wherein the FinFET is p-type, the channel-masking feature includes a gate, the fin is a group-IVA elemental or group-IVA compound semiconductor, the ion implantation is performed using a gas selected from the group consisting of $SiF_4$, $GeF_4$, and $N_2$, a dose of the ion implantation is in the range between about $10^{15}$ and about $10^{17}$ cm$^{-2}$, an energy of the ion implantation is in the range between about 5 and 30 keV, and a tilt angle of the ion implantation in the direction of a length of the channel region is in the range between zero and about 30 degrees. In an embodiment, the method, wherein the FinFET is p-type, the channel-masking feature includes a gate, the fin is a group-IVA elemental or group-IVA group WB compound semiconductor, the ion implantation is performed using a gas selected from the group consisting of $SiF_4$, $GeF_4$, and $N_2$, a dose of the ion implantation is in the range between about $10^{15}$ and about $10^{17}$ cm$^{-2}$, an energy of the ion implantation is in the range between about 5 and 30 keV, a tilt angle of the ion implantation in the direction of a length of the channel region is in the range between zero and about 30 degrees, and a tilt angle of the ion implantation in the direction of a width of the fin is in the range between zero and about 30 degrees. In an embodiment, the method, wherein the FinFET is n-type, the channel-masking feature includes a gate, the fin is a group-IVA elemental or group-IVA compound semiconductor, the ion implantation is performed using a gas selected from the group consisting of $CO_2$ and $N_2$, a dose of the ion implantation is greater than about $10^{15}$ and about $10^{17}$ cm$^{-2}$, an energy of the ion implantation is less than about 15 keV, and a tilt angle of the ion implantation in the direction of a length of the channel region is in the range between zero and about 30 degrees. In an embodiment, the method, wherein the FinFET is n-type, the channel-masking feature includes a gate, the fin is a group-IVA elemental or group-IVA compound semiconductor, the ion implantation is performed using a gas selected from the group consisting of $CO_2$ and $N_2$, a dose of the ion implantation is greater than about $10^{15}$ and about $10^{17}$ $cm^{-2}$, an energy of the ion implantation is less than about 15 keV, a tilt angle of the ion implantation in the direction of a length of the channel region is in the range between zero and about 30 degrees, and a tilt angle of the ion implantation in the direction of a width of the fin is in the range between zero and about 30 degrees. In an embodiment, the method, further including performing a second ion implantation, wherein said second ion implantation is an LDD implantation performed to form an LDD region, and said annealing anneals said first and second ion implantations. In an embodiment, the method, wherein the FinFET is a p-FinFET disposed on a wafer, the channel-masking feature includes a gate, and the method further includes disposing a patterned masking layer on the wafer before said first ion implantation, the patterned masking layer covering an n-FinFET and leaving said p-FinFET uncovered, and performing a second ion implantation while said patterned masking layer is disposed on the wafer, the second ion implantation being a PLDD implantation performed to form a PLDD region. In an embodiment, the method, wherein the FinFET is an n-FinFET disposed on a wafer, the channel-masking feature includes a gate, and the method further includes disposing a patterned masking layer on the wafer before said first ion implantation, the patterned masking layer covering a p-FinFET and leaving said n-FinFET uncovered, and performing a second ion implantation while said patterned masking layer is disposed on the wafer, said second ion implantation being an NLDD implantation performed to form an NLDD region. In an embodiment, the method, wherein the channel region is a III-V compound semiconductor, and the implant species is nitrogen, or belongs to group IIIA or group VA of the periodic table of elements.

It will also be readily understood by those skilled in the art that materials and methods may be varied while remaining within the scope of the present disclosure. It is also appreciated that the present disclosure provides many applicable inventive concepts other than the specific contexts used to illustrate embodiments. Accordingly, the appended claims are intended to include within their scope such processes, machines, manufacture, compositions of matter, means, methods, or steps.

What is claimed is:

1. A device comprising:
a transistor having a channel region, the channel region containing a constituent element and excess atoms, the constituent element belonging to a group of the periodic table of elements, wherein
said excess atoms are nitrogen, or belong to said group of the periodic table of elements, and
a concentration of said excess atoms in the channel region is in the range between about $10^{19}$ $cm^{-3}$ and about $10^{21}$ $cm^{-3}$; and
an isolation region adjacent the transistor, the isolation region also containing said excess atoms at a concentration in a range between about $10^{20}$ $cm^{-3}$ and about $10^{21}$ $cm^{-3}$.

2. The device of claim 1, wherein:
the channel region is an elemental group-IV or compound group-IV semiconductor,
the transistor is a p-FinFET, and
the excess atoms are selected from the group consisting of Si, Ge, and nitrogen.

3. The device of claim 1, wherein:
the channel region is an elemental group-IV or compound group-IV semiconductor,
the transistor is an n-FinFET, and
the excess atoms are selected from the group consisting of carbon and nitrogen.

4. The device of claim 1, wherein:
the channel region is a III-V compound semiconductor, and
said excess atoms are nitrogen, or belong to groups III or V of the periodic table of elements.

5. The device of claim 1, wherein said isolation region is a portion of an insulating material at least partially surrounding the transistor.

6. The device of claim 1, wherein said excess atoms impose strain on the channel region.

7. The device of claim 1, wherein the isolation region imposes strain below the channel region.

8. A device comprising:
a gate, wherein an upper width of the gate is larger than a lower width of the gate by a value exceeding about 1 nanometer,
a channel region containing a constituent element and excess atoms, the constituent element belonging to a group of the periodic table of elements, wherein said excess atoms are nitrogen, or belong to said group of the periodic table of elements, and
a concentration of said excess atoms in the channel region is in the range between about $10^{19}$ $cm^{-3}$ and about $10^{21}$ $cm^{-3}$.

9. The device of claim 8, wherein:
the device is a FinFET and further comprising an isolation region adjacent the FinFET, the isolation containing said excess atoms at a concentration in the range between about $10^{20}$ $cm^{-3}$ and about $10^{21}$ $cm^{-3}$.

10. The FinFET of claim 9, wherein:
the fin extends above a topmost surface of the isolation region.

11. The FinFET of claim 9, wherein:
an area concentration of said excess atoms in a free full-fin region is at least $10^{15}$ $cm^{-2}$.

12. The device of claim 8, wherein said excess atoms impose strain on the channel region.

13. The device of claim 8, wherein the device is a FinFET having a fin, and further comprising an insulating material adjacent the fin, wherein additional excess atoms in the insulating material impose strain on the fin.

14. The device of claim 8, wherein said excess atoms impose strain on the channel region.

15. A device comprising:
a transistor having a channel region, the channel region containing a constituent element and excess atoms, the constituent being an elemental group-IV or compound group-IV semiconductor, wherein
said excess atoms are selected from the group consisting of Ge, carbon, and nitrogen, with a concentration of said excess atoms in the channel region being in the range between about $10^{19}$ $cm^{-3}$ and about $10^{21}$ $cm^{-3}$;
a gate over the channel region, an upper width of the gate being larger than a lower width of the gate by at least 1 nanometer; and
an isolation region adjacent the transistor, the isolation region also containing said excess atoms at a concentration in a range between about $10^{20}$ $cm^{-3}$ and about $10^{21}$ $cm^{-3}$.

16. The device of claim 15, wherein the gate extends over the channel region and further extends over at least one additional channel region.

17. The device of claim 15, the transistor further comprising a source region and a drain region, the device further comprising an air gap under the source region, the drain region, or both the source region and the drain region.

18. The device of claim 15, wherein said excess atoms impose strain on the channel region.

19. The device of claim 15, wherein the transistor is a FinFET having a fin, and further wherein the isolation region imposes strain on a lower portion of the fin.

* * * * *